US010251280B2

(12) United States Patent
Williams et al.

(10) Patent No.: US 10,251,280 B2
(45) Date of Patent: Apr. 2, 2019

(54) INTEGRATED CIRCUIT WITH MICRO INDUCTOR AND MICRO TRANSFORMER WITH MAGNETIC CORE

(71) Applicant: Texas Instruments Incorporated, Dallas, TX (US)

(72) Inventors: Byron Lovell Williams, Plano, TX (US); Asad Mahmood Haider, Plano, TX (US); Licheng M. Han, Frisco, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 15 days.

(21) Appl. No.: 14/576,708

(22) Filed: Dec. 19, 2014

(65) Prior Publication Data

US 2015/0187488 A1    Jul. 2, 2015

Related U.S. Application Data

(60) Provisional application No. 61/922,528, filed on Dec. 31, 2013.

(51) Int. Cl.
| | |
|---|---|
| *H01F 5/00* | (2006.01) |
| *H05K 3/06* | (2006.01) |
| *H01F 17/00* | (2006.01) |
| *H01F 41/04* | (2006.01) |

(52) U.S. Cl.
CPC ............ *H05K 3/061* (2013.01); *H01F 5/00* (2013.01); *H01F 17/0033* (2013.01); *H01F 41/046* (2013.01); *Y10T 29/49073* (2015.01)

(58) Field of Classification Search
CPC .................... H01F 5/00; H01F 27/00–27/36
USPC ............... 336/65, 200, 206–208, 232–234
See application file for complete search history.

(56) References Cited

U.S. PATENT DOCUMENTS

| | | | | | |
|---|---|---|---|---|---|
| 3,210,707 | A | * | 10/1965 | Constantakes | H01F 17/0033 174/260 |
| 3,305,814 | A | * | 2/1967 | Moyer | 257/108 |
| 3,413,716 | A | * | 12/1968 | Schwertz | H01F 17/0033 29/602.1 |
| 3,614,554 | A | * | 10/1971 | Shield | H01F 17/0033 257/531 |
| 5,070,317 | A | * | 12/1991 | Bhagat | B81B 7/0077 257/531 |
| 5,767,563 | A | * | 6/1998 | Imam | H01L 27/0688 257/281 |
| 5,781,091 | A | * | 7/1998 | Krone | H01F 17/0033 336/200 |
| 6,148,500 | A | * | 11/2000 | Krone | H01F 17/0033 29/602.1 |
| 6,249,039 | B1 | * | 6/2001 | Harvey | H01F 17/0006 257/528 |
| 6,303,971 | B1 | * | 10/2001 | Rhee | H01F 17/0033 257/531 |
| 6,998,652 | B1 | * | 2/2006 | Horch | H01L 27/0629 257/137 |

(Continued)

*Primary Examiner* — Tuyen Nguyen
(74) *Attorney, Agent, or Firm* — Jacqueline J. Garner; Charles A. Brill; Frank D. Cimino (57) ABSTRACT

An integrated circuit with a micro inductor or with a micro transformer with a magnetic core. A process of forming an integrated circuit with a micro inductor with a magnetic core. A process of forming an integrated circuit with a micro transformer with a magnetic core.

4 Claims, 12 Drawing Sheets

(56) References Cited

U.S. PATENT DOCUMENTS

| | | | |
|---|---|---|---|
| 7,107,666 B2* | 9/2006 | Hiatt | H01F 17/0006 29/602.1 |
| 7,196,607 B2* | 3/2007 | Pleskach | H01F 17/0033 257/E23.062 |
| 7,573,119 B2* | 8/2009 | Kobayashi | H01L 23/3114 257/531 |
| 7,868,431 B2* | 1/2011 | Feng | H01F 17/0033 257/673 |
| 8,217,748 B2* | 7/2012 | Feng | H01F 17/0033 336/200 |
| 8,558,344 B2* | 10/2013 | Chen | H01L 28/10 257/531 |
| 2006/0170527 A1* | 8/2006 | Braunisch | H01F 17/0006 336/223 |
| 2008/0198560 A1* | 8/2008 | Fujiwara | H01F 17/0013 361/728 |

* cited by examiner

INTEGRATED CIRCUIT WITH MICRO INDUCTOR AND MICRO TRANSFORMER WITH MAGNETIC CORE

CROSS-REFERENCE TO RELATED APPLICATIONS

This application claims the benefit of priority under U.S.C. § 119(e) of U.S. Provisional Application 61/922,528, filed Dec. 31, 2013), the contents of which are hereby incorporated by reference.

FIELD OF INVENTION

This invention relates to the field of integrated circuits. More particularly, this invention relates to micro inductors and micro transformers in integrated circuits.

BACKGROUND

In the fabrication of integrated circuit structures, active devices such as MOS and bipolar transistors are formed. Passive electronic devices such as capacitors, resistors, inductors, and transformers are also typically formed either in the substrate or in conductive materials formed over the integrated circuit transistors.

Inductors are often used in various microelectronic applications such as voltage control oscillators and power amplifiers. In addition, inductors are often used in radio frequency (RF) circuits such as those used in devices like cellular telephones, wireless modems, and other types of wireless communication equipment.

Transformers are frequently used to pass signals from a first integrated circuit or sub circuit that operates at one voltage to a second integrated circuit or sub circuit that operates with a different voltage.

Inductors and transformers typically require significant area when formed on an integrated circuit. Some system designers have sought to eliminate the use of the relatively large inductors and transformers by simulating those using active circuits. Unfortunately, simulated inductor and transformer circuits tend to exhibit large parasitic effects and often generate more noise than circuits which utilize conventional inductors and transformers.

When unable to eliminate inductors and transformers in their designs, designers have sought ways to reduce the size of the inductors and transformers. For example, inductors and transformers are miniaturized for use in compact communication systems, such as cellular phones and modems. These miniaturized inductors and transformers typically comprise three-dimensional spiral air core inductors and transformers that may be fabricated on the same substrates as the integrated circuits to which they are coupled. Although these three-dimensional spiral air core inductors and transformers may be fabricated using conventional integrated circuit manufacturing techniques, they typically take up a disproportionately large share of the available area.

In addition, spiral air core inductors and transformers have an open magnetic field which may generate interference and/or undesirable magnetic coupling that may cause circuit instability problems. In addition the spiral air core inductors may not be suitable for high frequency applications because their large size presents large resistance and large parasitic capacitance resulting in a self-resonate frequency that is lower than the operation frequency.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit with a micro inductor or with a micro transformer with a magnetic core is described. An integrated circuit is formed with a micro inductor with a magnetic core. An integrated circuit is formed with a micro transformer with a magnetic core.

BRIEF DESCRIPTION OF THE DRAWINGS

FIG. 1A through 1J are cross sections of steps in the fabrication of integrated circuits with micro inductors formed according to principles of the invention.

FIG. 2A through 2J are plan views of steps in the fabrication of integrated circuits with micro inductors formed according to principles of the invention.

FIG. 4A through 4C are cross sections of steps in the fabrication of integrated circuits with micro inductors or transformers formed according to principles of the invention.

FIG. 5A through 5C are cross sections of steps in the fabrication of integrated circuits with micro inductors or transformers formed according to principles of the invention.

FIG. 6A through 6C are cross sections of steps in the fabrication of integrated circuits with micro inductors or transformers formed according to principles of the invention.

FIG. 7A through 7C are cross sections of steps in the fabrication of integrated circuits with micro inductors or transformers formed according to principles of the invention.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Inductors and transformers with a smaller area are highly desirable for integrated circuits such as those used in cell phones and other portable electronic devices. Addition of a magnetic core to an inductor and transformer significantly increases inductance enabling an inductor and transformer with an equivalent inductance to be built in a much smaller area (micro inductor and micro transformer). In addition, the coils in the smaller micro inductors and micro transformers are significantly shorter and therefore have significantly lower series resistance and significantly higher Q. This lower resistance enables the embodiment micro inductor and micro transformer to operate with lower power and with higher frequency.

Figure 1A:
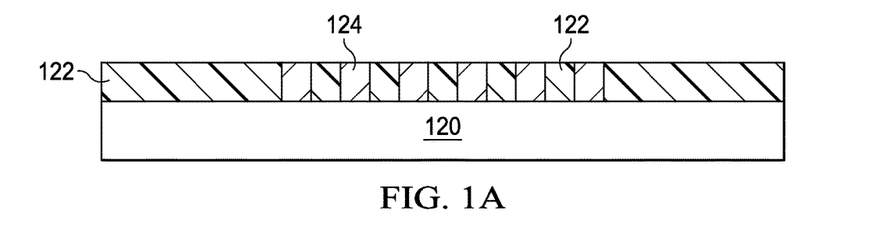
Figure 1B:
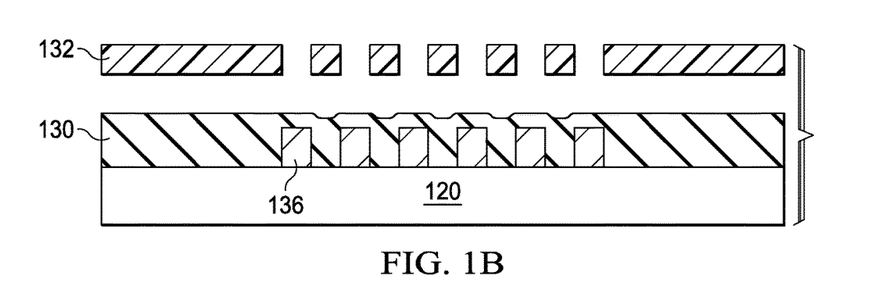
Figure 1C:
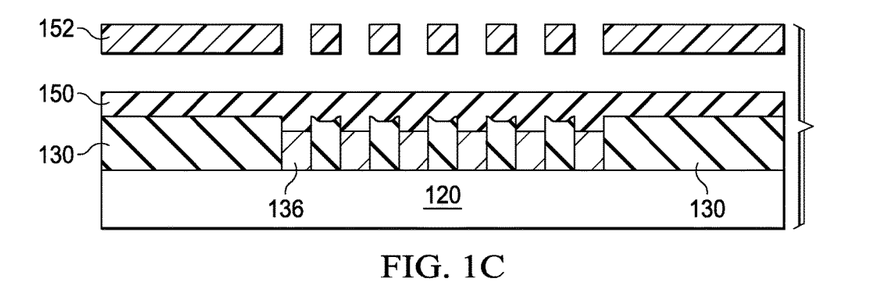
Figure 1D:
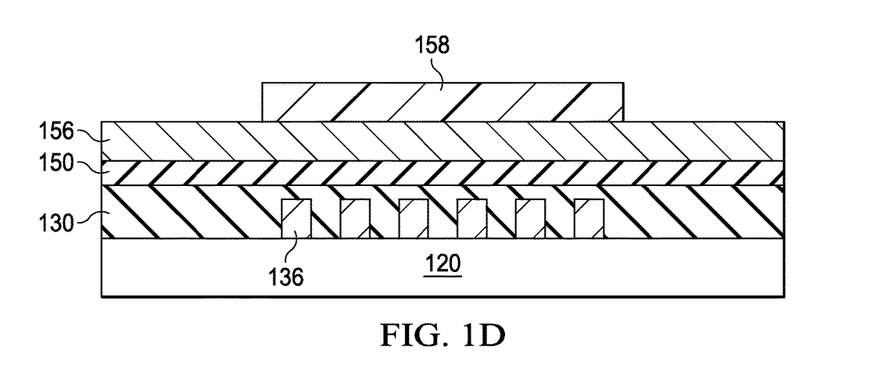
Figure 1E:
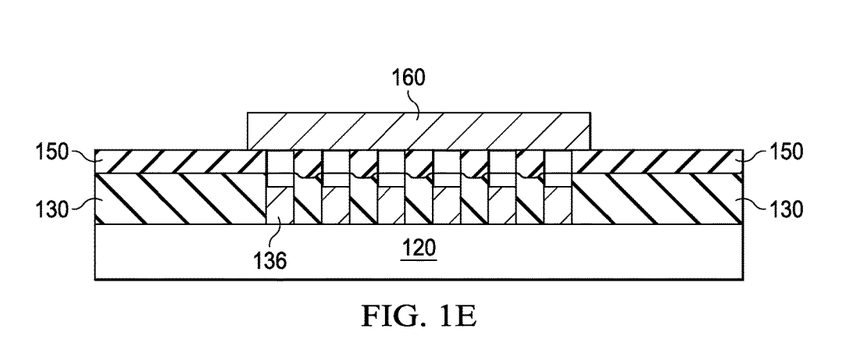
Figure 1F:
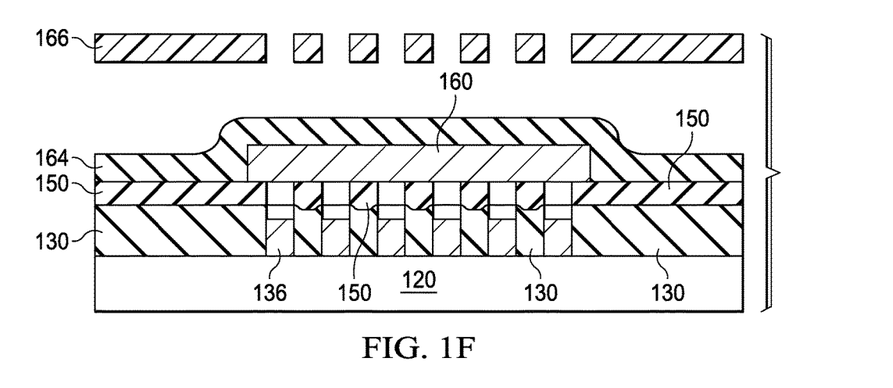
Figure 1G:
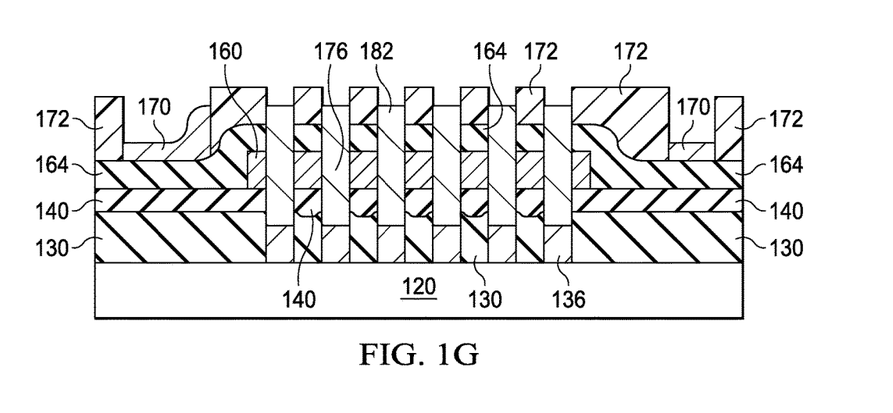
Figure 1H:
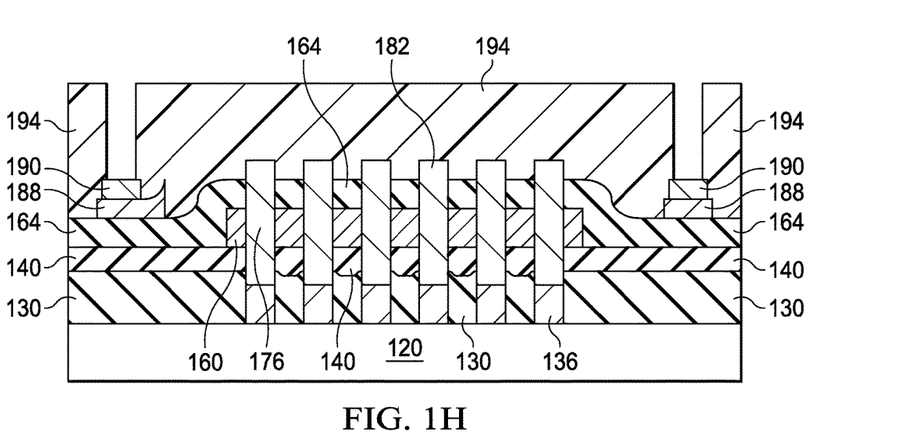
Figure 1I:
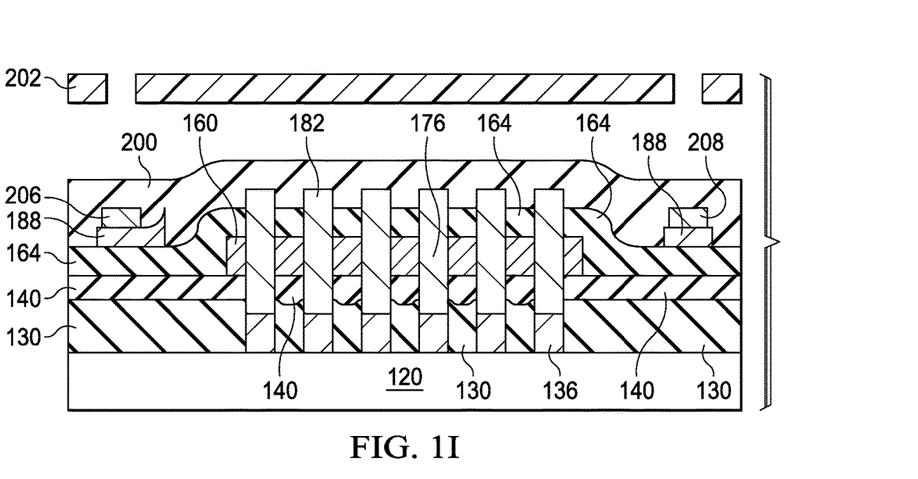
Figure 1J:
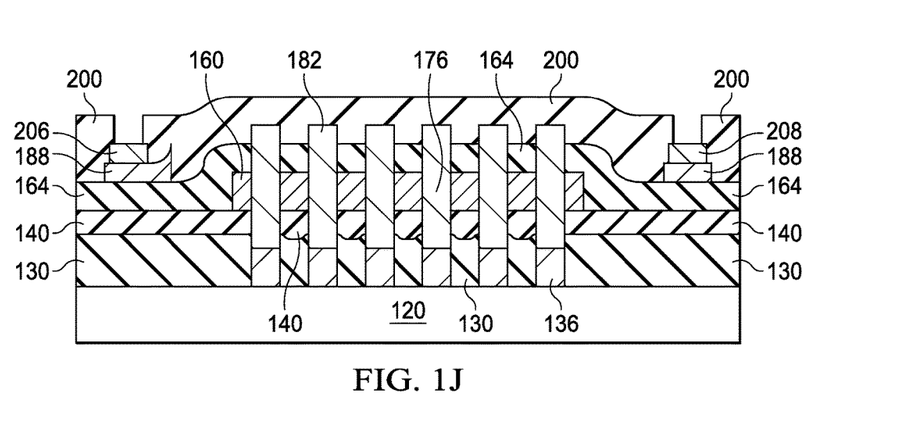
Figure 2A:
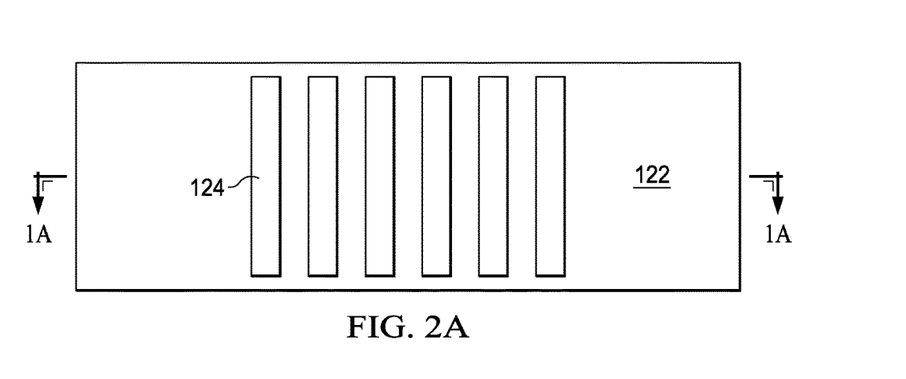
Figure 2B:
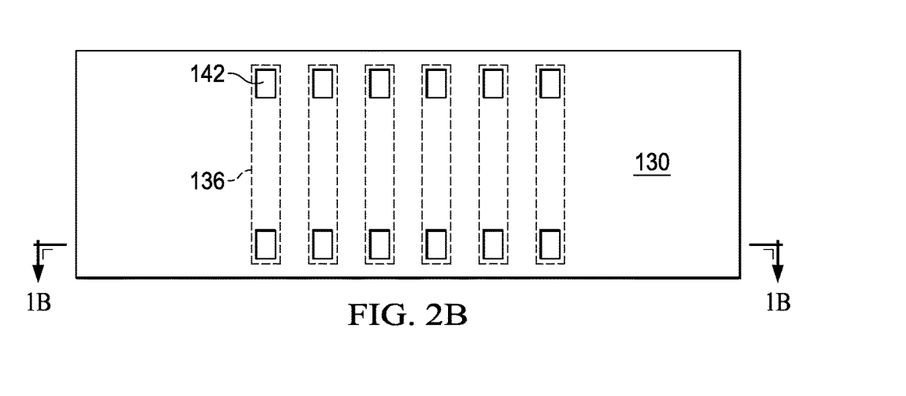
Figure 2C:
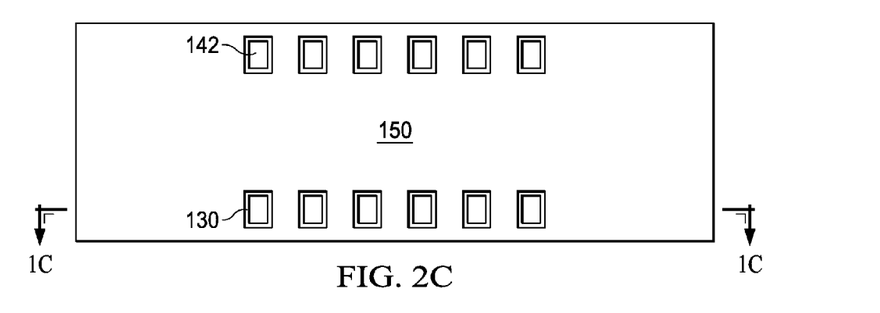
Figure 2D:
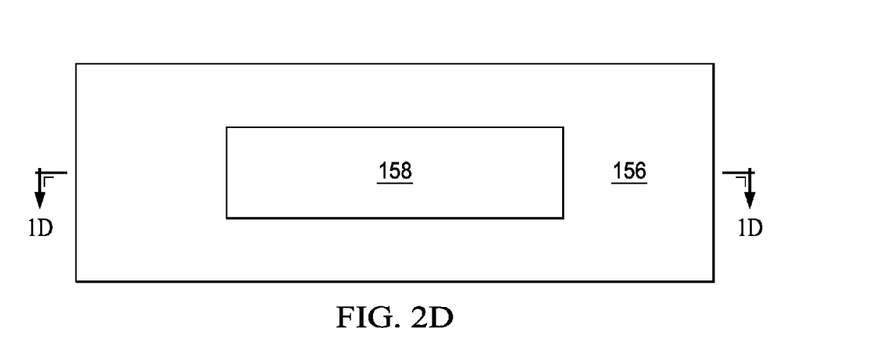
Figure 2E:
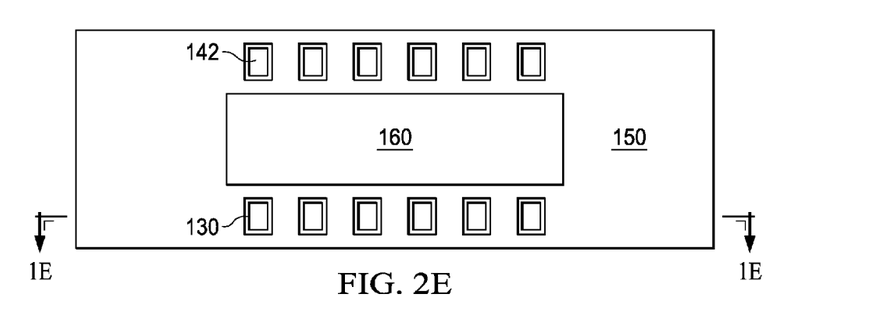
Figure 2F:
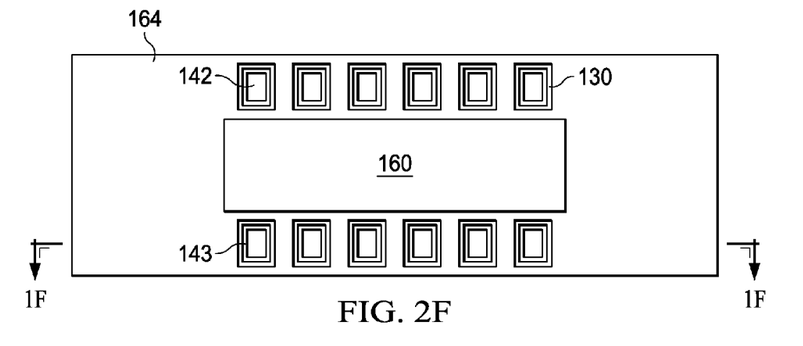
Figure 2G:
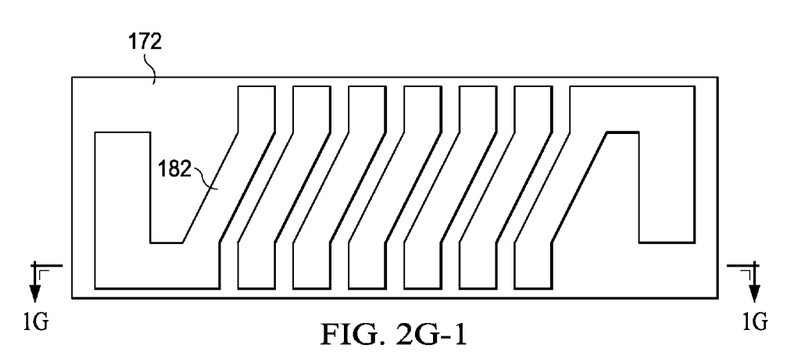
Figure 2G:
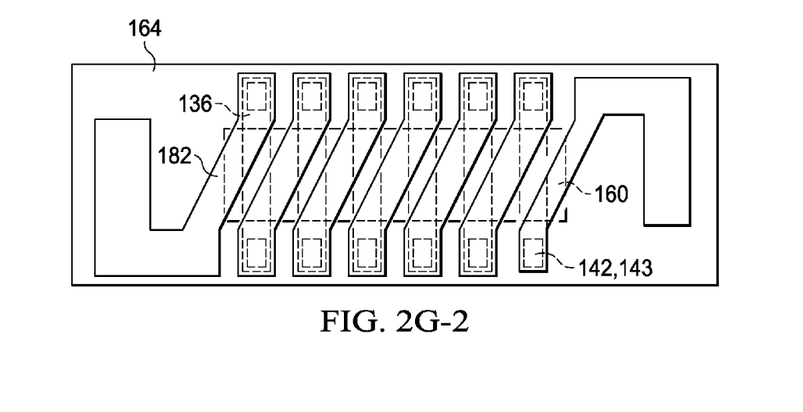
Figure 2H:
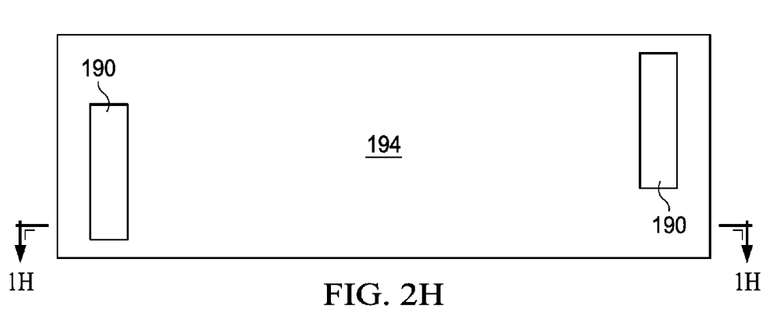
Figure 2I:
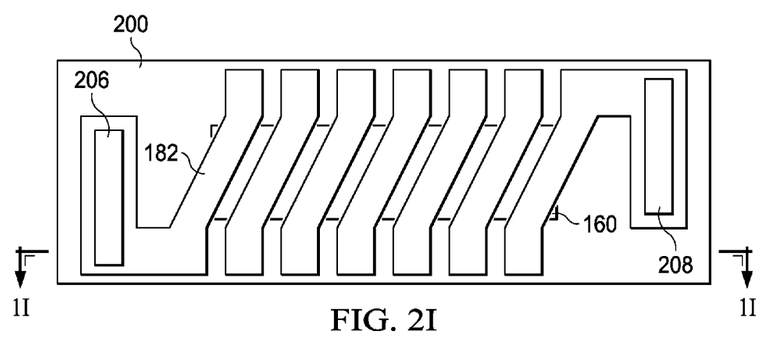
Figure 2J:
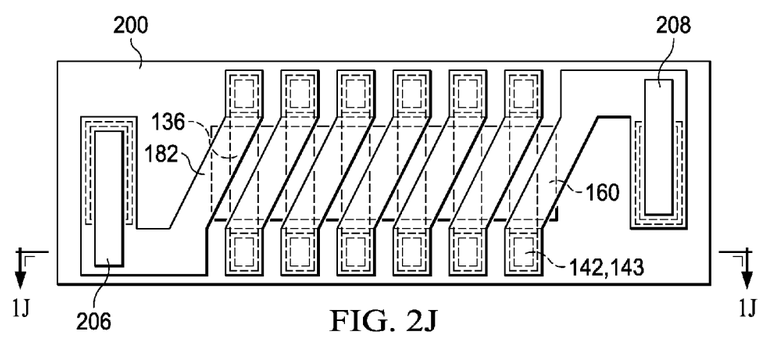

A top down view and a cross sectional view of an example embodiment micro inductor are shown in FIGS. 2J and 1J respectively. The embodiment micro inductor may be a standalone device that is later coupled to an integrated circuit or may be embedded in an integrated circuit manufacturing flow. The embodiment micro inductor in FIG. 1J is manufactured on a substrate 120 which may be a dielectric layer on a support wafer or may be dielectric on a wafer with an underlying integrated circuit. The embodiment micro inductor coil is constructed around a magnetic core 160 which enables the embodiment micro inductor to be built in a significantly smaller area than an air core inductor with equivalent inductance. The micro inductor coil which is winds around the magnetic core is comprised of inductor coil bottom metal leads 134 which underlie the magnetic core 160, inductor coil side metal leads 176 on both sides of the magnetic core 160, and inductor core top metal leads 182 which overlie the magnetic core 160. Dielectric layers 130, 140, and 164 electrically isolate the inductor coil from the magnetic core 160. An overlying dielectric passivation layer 200 protects the embodiment micro inductor from the environment. Inductor contact openings 206 and 208 may be etched through the dielectric passivation layer 200 as shown in FIG. 1J to permit electrical contact to the ends of the inductor coil.

The major steps in an example process flow for manufacturing embodiment micro inductors are illustrated in FIGS. 1A through 1J (cross sectional view) and FIGS. 2A through 2J (top down view).

In FIGS. 1A and 2A a thin layer of sputtered TiW 116 in the range of about 0.3 and 0.4 um thick and seed copper layer 118 in the range of about 0.2 um and 0.3 um thick are deposited on the dielectric substrate 120. The dielectric substrate 120 may be $SiO_2$ on a wafer or may be a layer of polyimide on a wafer. The dielectric substrate 120 may be on a wafer that may or may not contain underlying integrated circuits. In an example embodiment standalone micro inductor the dielectric substrate 120 is about 5 um polyimide on a silicon dioxide coated wafer. In the example embodiment embedded micro inductor the substrate dielectric 120 is deposited on wafer containing an integrated circuit. In an example embodiment, 0.3 um of TiW 116 is deposited by sputtering and 0.2 um of seed copper layer 118 is deposited by sputtering. An inductor coil bottom lead photo resist pattern 122 is then formed with openings to form the inductor coil bottom leads 136. The inductor coil bottom leads 136 may be straight and run perpendicular to and under the inductor core. Copper is then electroplated with a thickness in the range of 5 to 25 microns and planarized using chemical mechanical polish (CMP) to form the inductor coil bottom leads 136.

FIGS. 1B and 2B show the embodiment inductor after the photoresist pattern 122 is removed and seed copper and TiW are etched from between the inductor coil bottom leads 136. A dielectric layer 130 is then deposited over the inductor coil bottom leads 136 and planarized. The dielectric layer 130 may be a material such as silicon dioxide, silicon nitride, or may be a spin-on photo active polymer such as polyimide, polybenzobisoxazole (PBO), SU-8 (epoxy-based photo active polymer), or BCB (benzocyclobutene-based photosensitive polymer). A photosensitive polyimide material is used to illustrate the embodiment. The photo sensitive polyimide material of dielectric layer 130 is deposited using a process such as spin coating. The photo sensitive polyimide material on the embodiment micro inductor is then exposed using photo mask 132. The photosensitive polyimide material is developed to form inductor coil first via openings 142 (FIG. 2B) in which the embodiment micro inductor coil side leads will be formed. In an example micro inductor, the photo sensitive polyimide material is spin coated to a thickness of about 10 to 20 um. The polyimide is then baked at about 400° C. for about 60 min. In an example embodiment micro inductor the thickness of the photosensitive polyimide is in the range of about 5 to 10 microns post bake.

As shown in FIGS. 1C and 2C a second layer of dielectric 150 may be deposited and planarized. In an example embodiment micro inductor the second layer of dielectric 150 comprises photosensitive polyimide material. The photosensitive polyimide material is exposed using photo mask 152 to form micro inductor coil via openings 142 (FIG. 2C). The side coil leads for the embodiment micro inductor are formed in these micro inductor via openings 142. In an example embodiment micro inductor the second layer of photosensitive polyimide material is spin-coated to a thickness of about 10 um to 20 um. After exposure and develop, the polyimide material is then baked at about 400 C for about 60 min. In an example embodiment micro inductor the thickness of the photosensitive polyimide material is in the range of about 5 to 10 microns post bake.

Referring now to FIGS. 1D and 2D, magnetic core material 156 is deposited. A magnetic core photoresist pattern 158 is formed on the magnetic core material 156. The magnetic core material 156 may be a metallic material with a high resistivity and with a high magnetic permeability such as CoZrTa, CoP, or CoFeHfO. In an embodiment micro inductor the magnetic core material is CoZrTa with a thickness in the range of about 1 to 20 microns. In an example embodiment inductor the magnetic core material is CoZrTa with a thickness of about 8 microns.

An embodiment micro inductor is shown in FIGS. 1E and 2E after the magnetic core material 156 is etched to form the magnetic core 160. In an embodiment micro inductor with CoZrTa magnetic core material the magnetic core material 156 is etched using nitric acid.

A dielectric layer 164 is then deposited over the magnetic core 160 as shown in FIGS. 1F and 2F. The dielectric material may be silicon dioxide, silicon nitride, or a spin-on photo active polymer such as polyimide, polybenzobisoxazole (PBO), SU-8 (epoxy-based photo active polymer), or BCB (benzocyclobutene-based photosensitive polymer). In an example embodiment the dielectric layer 164 is a photosensitive polyimide layer. Photo mask 166 is used to expose micro inductor coil second vias 143 along both sides of the magnetic core 160 as shown in FIG. 2F. The photo sensitive material 164 is developed post exposure to form micro inductor coil second vias 143 in which the inductor coil side leads are formed. The first vias 142 lie within the second vias 143 forming a continuous opening to the micro inductor coil bottom leads. In an example embodiment micro inductor the dielectric layer of photosensitive polyimide 164 is spin-coated to a thickness of about 10 um to 20 um. After exposure and develop, the polyimide layer 164 is then baked at about 400° C. for about 60 min. In an example embodiment micro inductor the thickness of the photosensitive polyimide 164 is in the range of about 5 to 10 microns post bake.

As shown in FIGS. 1G and 2G-1, thin layers of TiW 181 (approximately 0.3 um) and seed copper 183 (approximately 0.2 um) are then deposited onto dielectric layer 164. Inductor coil top lead photo resist pattern 172 is then formed on the seed copper layer 183. Copper metal 170 is electroplated to fill the inductor coil vias 142 and 143 (FIG. 2G-2) forming the inductor coil side leads 176 as shown in FIG. 1G and to form the inductor coil top leads 182 as shown in FIG. 2G-1. A top down view of the embodiment inductor is shown in FIG. 2G-2. A first end of the inductor coil top leads 182 are connected to a first end of the inductor coil bottom leads 136 by a first set of inductor coil side leads 176 on a first side of the magnetic core 160 and a second end of the inductor coil top leads 182 are connected to a second end of the inductor coil bottom leads by a second set of inductor coil side leads on a second side of the magnetic core 160 to form the micro inductor coil. The micro inductor coil surrounds the magnetic core 160 and is electrically isolated from the magnetic core by dielectric.

Inductor coil top lead photo resist pattern 172 is then removed and the copper seed layer 183 and the TiW layer 181 are etched from between inductor coil top leads 182 to electrically isolate them.

As shown in FIGS. 1H and 2H, when top contacts to the ends of the inductor coil are to be formed, a layer of non-oxidizing metal 190 such as NiPd may be formed on the copper bond pads 188. This avoids having to form an electrical contact directly to copper which may be oxidized from exposure to air. After the transformer coil top lead photo resist pattern 172 is removed a NiPd bond pad pattern 194 with openings over the copper bond pads 188 may be formed on the embodiment micro inductor. NiPd may then be electroplate in the openings forming NiPd pads 190 on the copper bond pads 188.

Referring now to FIGS. 1I and 2I, a dielectric passivation layer 200 may be formed on the embodiment micro inductor. In an example embodiment micro inductor the dielectric layer 200 is photosensitive polyimide. The photosensitive polyimide dielectric 200 over the micro inductor may be exposed with a micro inductor contact mask 202 to form micro inductor contact pad areas 206 and 208 (FIG. 2I). In an example embodiment micro inductor the photosensitive polyimide layer 200 is spin-coated to a thickness of about 15 um. After exposure and develop, the polyimide is then baked at about 400° C. for about 60 min. In an example embodiment micro inductor the thickness of the photosensitive polyimide layer 200 is about 7.5 microns post bake.

As shown in FIGS. 1J and 2J, after polyimide layer 200 is exposed, developed and annealed, contact openings 206 and 208 which enable topside electrical contact to the ends of the inductor coil are formed.

Figure 5A:
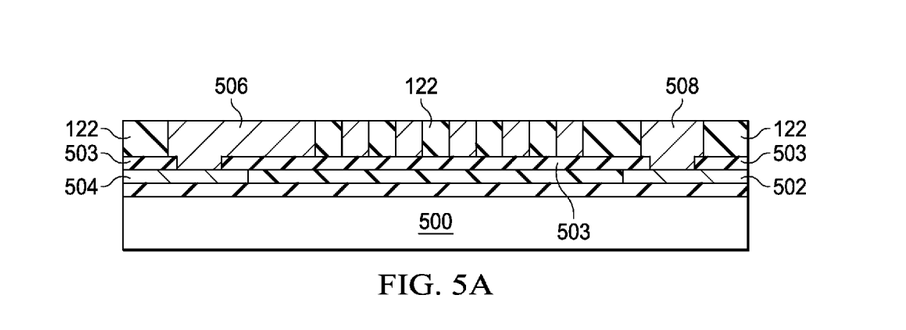
Figure 5B:
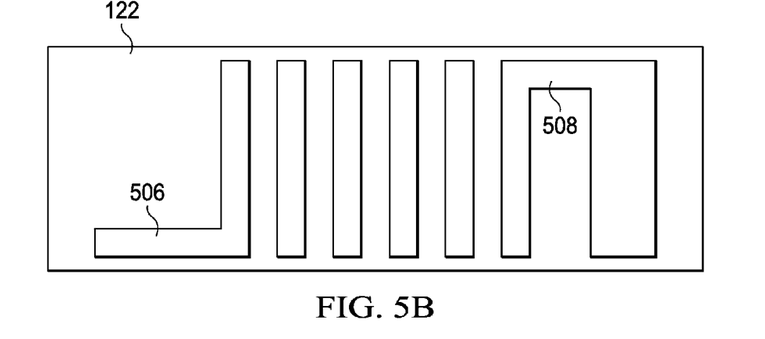
Figure 5C:
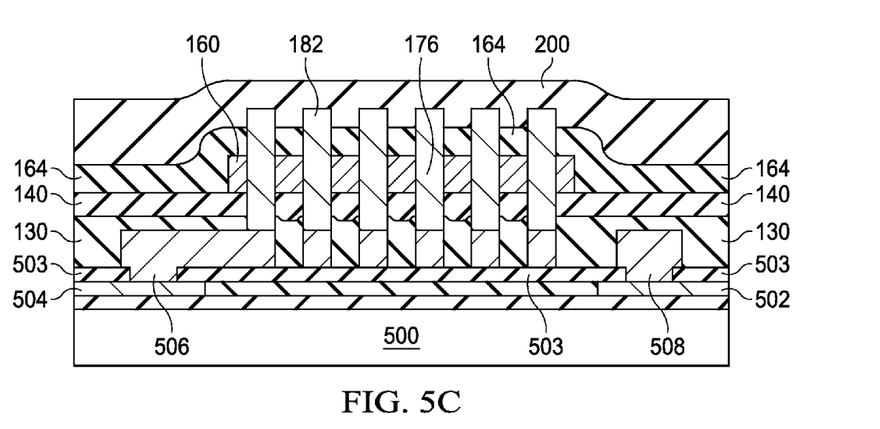

The embodiment inductor is illustrated with topside contacts. As is illustrated in FIGS. 5A, 5B, and 5C, with changes 506 and 508 to the inductor coil bottom stripe photo resist pattern 122 (FIGS. 1A and 2A) the embodiment inductor may also be formed with bottom contacts. Bottom contacts may be preferred when the embodiment micro inductor is embedded in an integrated circuit manufacturing flow.

Illustrated in FIGS. 5A, 5B and 5C is an embodiment micro inductor formed on top of an underlying integrated circuit 500. Bottom contacts 506 and 508 from the embodiment micro inductor are connected to bond pads 502 and 504 on the integrated circuit 500 through openings in the dielectric layer 503.

Figure 6A:
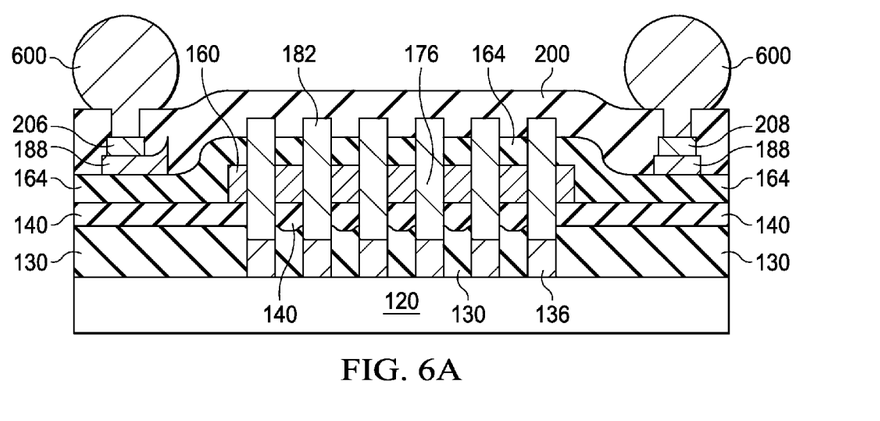
Figure 6B:
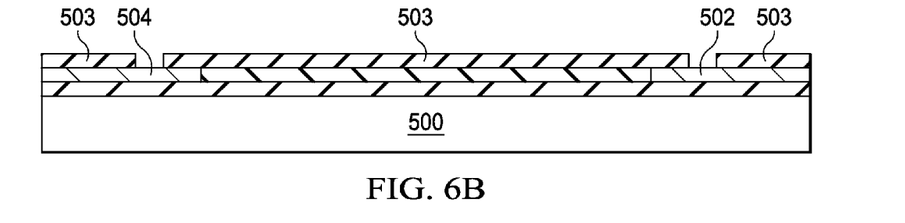
Figure 6C:
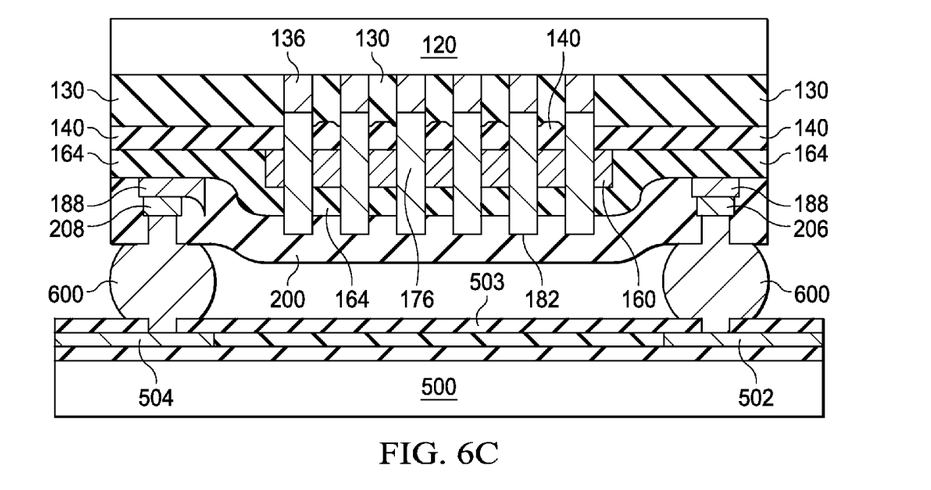

FIGS. 6A, 6B, and 6C, illustrate a standalone embodiment micro inductor flip chip ball bonded to an integrated circuit. Solder balls 600 may be formed on the inductor top contact pads 206 and 208 (FIG. 2J) and the embodiment micro inductor may be flip chip ball bonded to an underlying integrated circuit 500 or circuit board as shown in FIG. 6C.

Figure 7A:
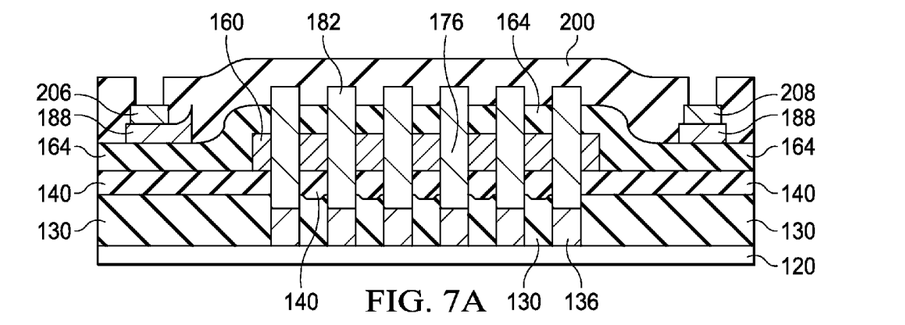
Figure 7B:
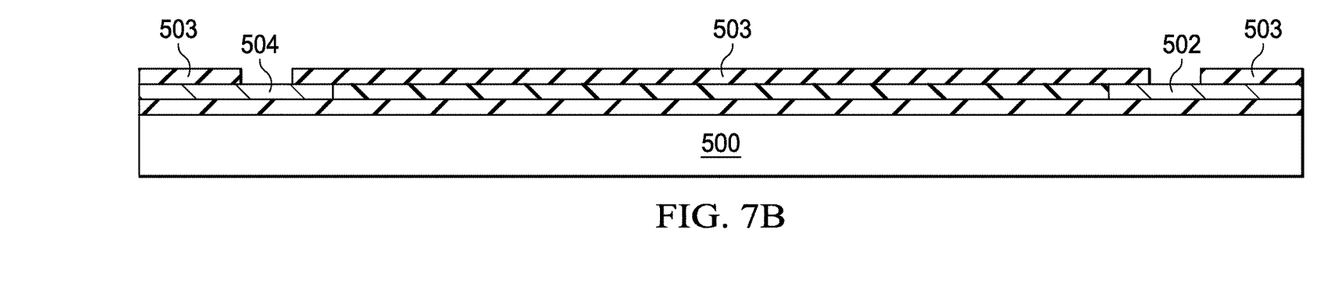
Figure 7C:
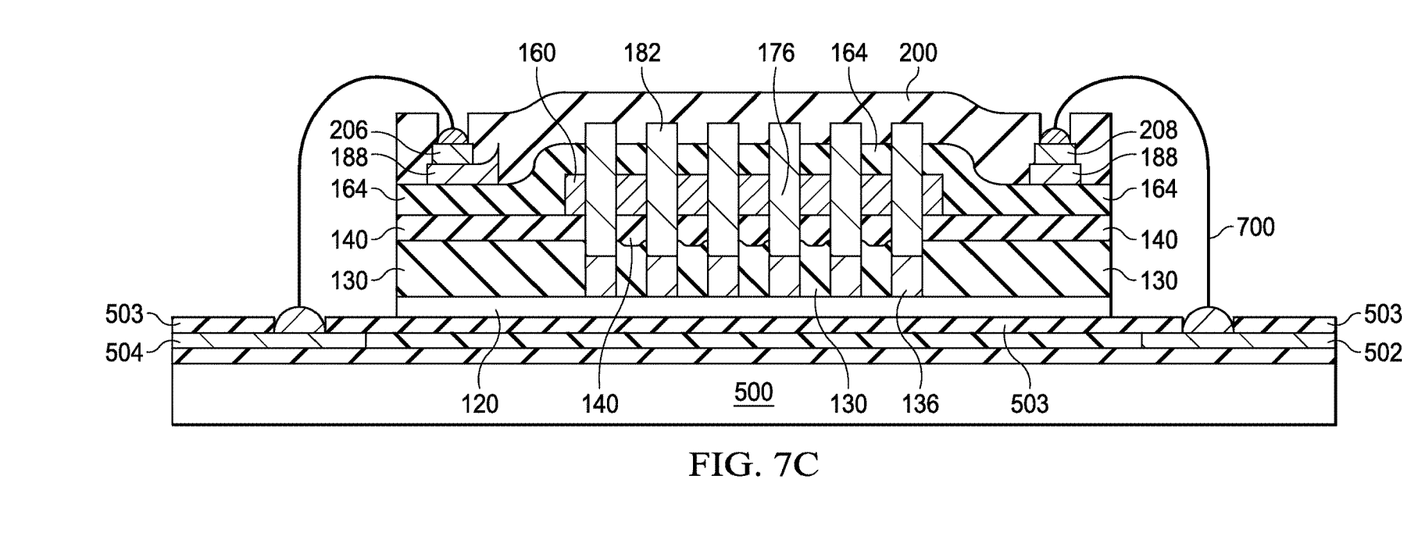

In yet another alternative for connecting a standalone embodiment micro inductor to an integrated circuit is illustrated shown in FIGS. 7A, 7B, and 7C. The embodiment micro inductor may be connected to an integrated circuit 500 or circuit board using wire bonds 700.

Although the bonding techniques described in FIGS. 5, 6, and 7 are illustrated using an embodiment micro inductor, these techniques also apply to an embodiment micro transformer.

Figure 3:
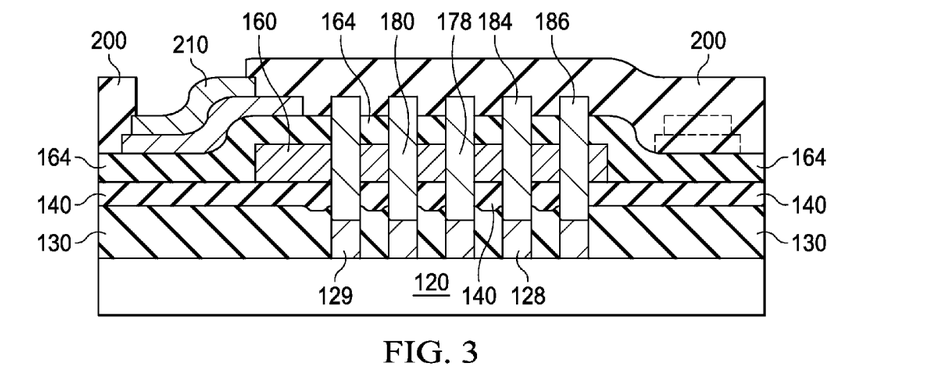
FIG. 3 is a cross sectional view of a micro transformer formed according to principles of the invention.
Figure 4A:
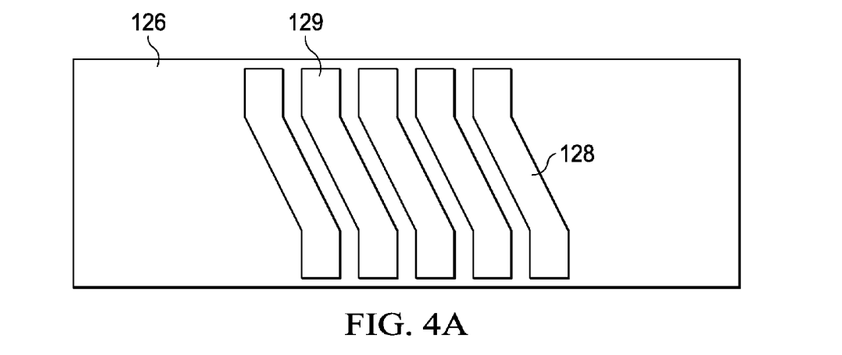
Figure 4B:
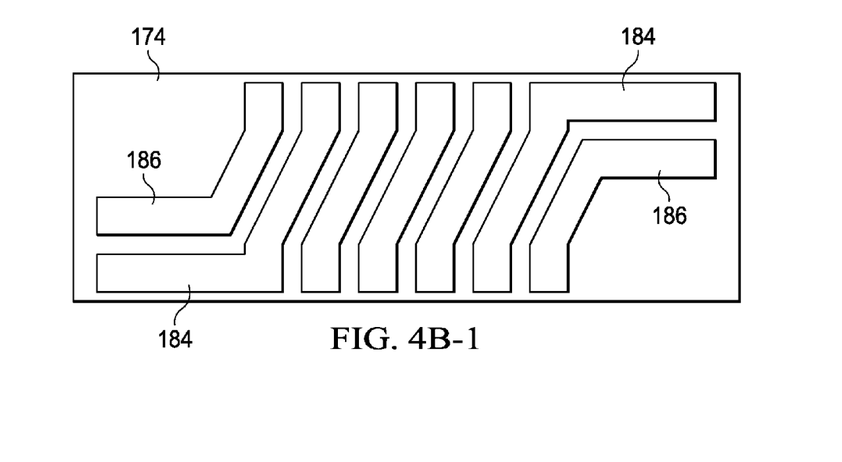
Figure 4B:
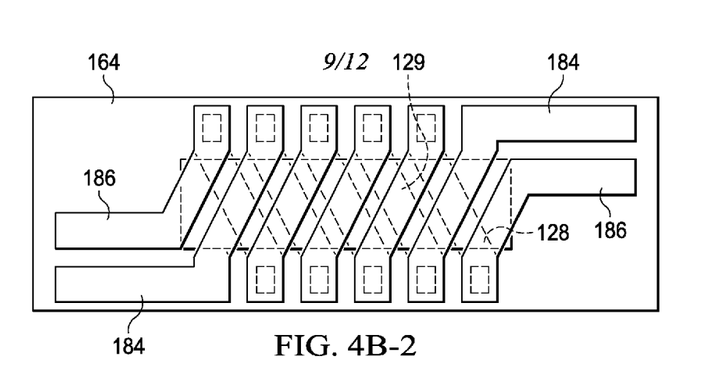
Figure 4C:
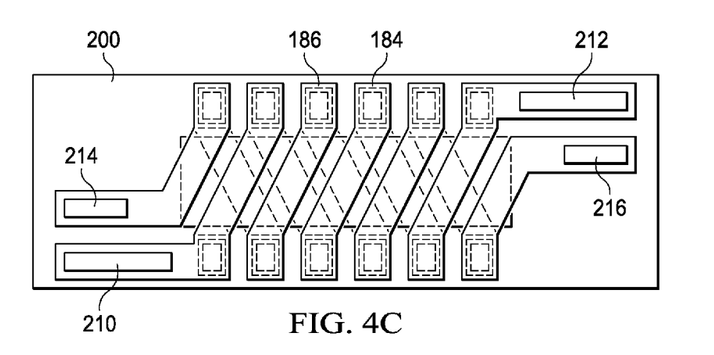

A top down view and a cross sectional view of an example embodiment micro transformer are shown in FIGS. 4C and 3 respectively. The transformer may be a standalone device or may be embedded in an integrated circuit manufacturing flow. The embodiment micro transformer may be formed using the same process steps as the embodiment micro inductor. The photo lithography patterns which form the top and bottom leads for the inductor coil are changed to enable the formation of at least two electrically isolated transformer coils surrounding the magnetic core. The embodiment micro transformer is built on a substrate 120 which may be a dielectric layer on a wafer or may be a dielectric layer on a wafer with an underlying integrated circuit. The embodiment micro transformer coils are constructed around a magnetic core 160 which enables the embodiment micro transformer to be built in a significantly smaller area than an air core transformer with equivalent inductance. The micro transformer coils are formed with micro transformer coil bottom metal leads 128 and 129 which underlie the magnetic core 160, with mico transformer coil side metal leads 178 and 180 on both sides (in front and behind) of the magnetic core 160, and with micro transformer coil top metal leads 184 and 186 which overlie the magnetic core 160. Dielectric layers 130, 140, and 164 electrically isolate the micro transformer coils from the magnetic core 160. A dielectric passivation layer 200 seals the embodiment micro transformer from the environment. Micro transformer contacts may be etched through the dielectric passivation layer 200 permit electrical contact to the ends of the first micro transformer coil (FIG. 4C). Micro transformer contacts 210 and 212 are etched through the dielectric passivation layer 200 permit electrical contact to the ends of the first micro transformer coil. Micro transformer contacts 214 and 216 are etched through the dielectric passivation layer 200 permit electrical contact to the ends of the second micro transformer coil. The embodiment micro transformer is illustrated with two micro transformer coils. Any number of micro transformer coils with any number of windings may be used in practice.

Instead of forming electrical contacts 210, 212, 214, and 216 on the top of the micro transformer, the contacts may be formed to the micro transformer coils on the bottom of the micro transformer and coupled to underlying integrated circuit components in a manner similar to the micro inductor described in FIGS. 5A-5C.

The major steps in an example process flow for manufacturing embodiment micro transformers are the same as the major steps in the example process flow for manufacturing the micro inductor. The patterns for forming the micro inductor coil are changed so that two or more micro transformer coils are formed around the magnetic core instead of the one micro inductor coil.

As shown in FIG. 4A the bottom leads of the embodiment micro transformer in pattern 126 run diagonally under the magnetic core of the embodiment micro transformer. This provides two sets of leads 128 and 129 enabling two or more electrically independent micro transformer coils to be formed around the magnetic core to form an embodiment micro transformer. The micro transformer side leads 178 and 180 in FIG. 3A connect a lower micro transformer lead 136 and 138 to an adjacent upper micro transformer lead 184 and 186 to form two electrically independent micro transformer coils. The layout may be changed to connect the lower micro transformer leads to third or fourth removed upper transformer leads if 3 or 4 electrically independent transformer coils are desired. For purposes of illustration, two transformer coils are shown.

As shown in FIGS. 4B-1 and 4B-2, the top lead mask 174 has two sets of micro transformer top leads 184 and 186. As shown in FIG. 4B-2 upper micro transformer lead 186 is connected to lower micro transformer lead 128 to form a first micro transformer coil and upper micro transformer lead 184 is connected to lower transformer lead 129 to form a second micro transformer coil.

Those skilled in the art to which this invention relates will appreciate that many other embodiments and variations are possible within the scope of the claimed invention.

What is claimed is:

1. An integrated circuit, comprising:
a substrate;
a first dielectric layer above the substrate;
coil bottom leads positioned in the first dielectric layer;
a second dielectric layer on the first dielectric layer;
a magnetic core on the second dielectric layer and above the coil bottom leads;
a third dielectric layer on the second dielectric layer and the magnetic core;
coil top leads on the third dielectric layer and above the magnetic core;
coil side leads penetrating the first, second, and third dielectric layers and coupling the coil top leads to the coil bottom leads to form a coil winding around the magnetic core.

2. The integrated circuit of claim 1 further comprising;
a transformer incorporating the magnetic core, and having a first coil segment of the coil and a second coil segment of the coil electrically isolated from the first coil segment.

3. The integrated circuit of claim 1, wherein the magnetic core includes a material selected from a group consisting of CoZrTa, CoP, and CoFeHfO.

4. The integrated circuit of claim 1, wherein the magnetic core includes CoZrTa and the coil includes copper.

* * * * *